PNPN SEMICONDUCTOR TRANSLATING DEVICE AND METHOD OF CONSTRUCTION

Filed April 28, 1960 2 Sheets-Sheet 1

INVENTORS
FRED BARSON
JOHN GOW 3RD
BY Everett A. Gartrell
ATTORNEY 3,211,971
Patented Oct. 12, 1965

3,211,971

PNPN SEMICONDUCTOR TRANSLATING DEVICE AND METHOD OF CONSTRUCTION

Fred Barson, Wappingers Falls, and John Gow 3d, Marlboro, N.Y., assignors to International Business Machines Corporation, New York, N.Y., a corporation of New York Filed Apr. 28, 1960, Ser. No. 25,385
12 Claims. (Cl. 317—235)

The present invention is directed to semiconductor signal-translating devices and to the method of making them. More particularly the invention relates to germanium signal-translating devices having four contiguous zones of the opposite conductivity types. While such devices have a number of applications, they are particularly suited for switching purposes and hence will be described in that relation.

Thyratron electron tubes have been employed extensively to drive relays because of their ability to translate the relatively large currents necessary to operate those relays. Efforts to replace such tubes with solid-state devices have, in general, met with only moderate success. Special semiconductor devices or transistors capable of carrying moderately heavy currents and having point contact electrodes have been employed to some extent. In general, transistors with point contact electrodes have not proved entirely satisfactory because of fabrication difficulties and their limited current-carrying capabilities. Four-zone silicon transistors have also been tried to a limited extent. Unfortunately the control of the switching of these transistors to render them conductive has not been as simple as is desired for many applications and the cost of such transistors is considerably greater than is desired. Two germanium transistors of complementary types have also been proposed for use in switching circuits with the collector regions of the individual transistors connected to the base regions of the opposite transistor. Since two transistors with the described interconnections together with the various circuit components are required in order to accomplish the current-switching function, the cost of such a circuit has been greater than is usually desired. Four-zone germanium transistors have also been proposed for operating relays having coils connected in the load circuits of the transistors. A serious shortcoming of most such transistors has been their inability to withstand the high breakdown voltage, occasioned by avalanche breakdown, to which they are subjected when the transistors are in their non-conductive condition.

For driving relays in various circuit applications, it is desirable to employ a PNPN transistor of a suitable semiconductor material such as germanium, the transistor being capable of being held in a normally non-conductive condition by a small negative voltage such as —0.3 volt applied to the control base of the device. It is further desired from an operating standpoint, particularly in current-switching applications where the voltage swings are small, that the device be rendered conductive by a small change of nearly one-half volt in the base voltage in order to establish a heavy current flow which may be of the order of several hundred milliamperes in the load circuit, the flow continuing until it is interrupted by a mechanical opening of the load circuit which includes the relay coil or the current is limited in some other manner to a value less than the sustaining current of the device. During the OFF condition of the transistor, it may be required to withstand a peak inverse voltage of about 100 volts while translating only a small leakage current of approximately 1 milliampere. This peak inverse voltage requirement has been particularly difficult to achieve in germanium PNPN transistors.

In the copending application of Melvin Klein, Serial No. 822,385, filed June 23, 1959, entitled "Semiconductor Signal-Translating Device," and assigned to the same assignee as the present invention, there is described and claimed a germanium PNPN transistor having the desirable characteristics mentioned above. The PNP section of that transistor includes an emitter and a base which are formed on a P-type wafer by a post-alloy diffusion technique that employs a double-doped pellet containing antimony within the range of 0.6–1%, a very small amount of gallium within the range of 0.0025–0.0075%, and the balance lead. The transistor assembly that is being fabricated is held in an alloying furnace operating at a temperature of about 760° C. for about 45 minutes to permit the faster-diffusing N-type doping material antimony to diffuse from the double-doped pellet and produce a graded N-type region on the P-type wafer. As the assembly cools, the molten mass of lead, germanium, gallium and antimony begins to solidify and, because the segregation coefficient of the gallium is higher than that of antimony, a recrystallized P-type region forms on the N-type region and serves as the emitter. The extremely low gallium content in the emitter establishes a lower emitter injection efficiency and a consequent current gain of about 0.3 for the PNP section. These desirable characteristics enable that PNPN transistor to withstand a high peak inverse voltage of about 100 volts.

The current gain of the PNP section of the transistor just mentioned is primarily controlled by the emitter efficiency, which in turn is controlled by the composition of the doping pellet. This composition is more critical than is sometimes desired and influences the magnitude of the voltage drop across the PNP section when the transistor is conductive. For some applications it is desirable to reduce this potential drop to a minimum while at the same time maintaining a low current gain. Heretofore, this has been difficult to realize since increasing the doping level of the gallium desirable reduced the voltage drop while undesirably increasing the emitter efficiency. Also when the composition of the doping pellet is marginal, an unwanted intrinsic or N-type region may form as the recrystallized region forms on cooling.

It is an object of the present invention, therefore, to provide a new and improved four zone semiconductor device or transistor of unitary construction which avoids one or more of the above-mentioned disadvantages and limitations of prior such transistors.

It is another object of the present invention to provide a new and improved four zone semiconductor device which includes a floating base region, is capable of withstanding high breakdown voltage in its non-conductive condition, and further is capable of translating a high current in its conductive condition.

It is a further object of the invention to provide a new and improved germanium PNPN semiconductor device which is particularly suited for switching applications.

It is a still further object of the invention to provide a new and improved three-terminal PNPN transistor made of germanium.

It is an additional object of the invention to provide a new and improved PNPN transistor having during its fabrication dual means for controlling the current gain of the PNP section thereof.

It is another object of the present invention to provide a new and improved PNPN transistor which has a hook collector and a low conductive impedance at the junction associated with that collector.

It is yet another object of the invention to provide a new and improved method of making PNPN transistors which results in a high yield of devices meeting prescribed performance characteristics.

It is an object of the invention to provide a new and improved PNPN transistor having during its fabrication means for controlling the sustaining current of the device and the trigger point thereof.

It is also an object of the present invention to provide a new and improved PNPN transistor having a hook collector wherein the impurity content of the collector is not critical nor is it the sole factor which may be usefully employed to control the current gain of the PNP section of the transistor.

It is an additional object of the present invention to provide a new and improved method of making a semiconductor signal-translating device which includes a control zone having a low minority-carrier lifetime.

It is yet another object of the invention to provide a new and improved method of making PNPN semiconductor switching devices which affords a high yield of quality devices.

In accordance with a particular form of the invention, a semiconductor signal-translating device comprises a unitary body of semiconductor material including a first zone comprising a recrystallized region of one conductivity type contiguous with a diffused region of the aforesaid one type. A second zone and a third zone of the opposite conductivity type are part of the unitary body of semiconductor material. Each of the regions of the first zone is contiguous with one of the zones of the opposite conductivity type and together form a first transistor section. The unitary body of semiconductor material further includes a fourth zone of the aforesaid one conductivity type contiguous with one of the zones of the opposite conductivity type and forming therewith and with the first zone a second transistor section. The other of the zones of the aforesaid opposite conductivity type constitutes the emitter of the first transistor section which, with the recrystallized region, provide for the first section a current gain of substantially less than unity and impart to that first section a high breakdown voltage characteristic. The second transistor section has a characteristic which affords a higher current gain than the first section and is effective to provide for the device a desired overall current gain. The device further includes individual electrical connections thereto.

Further in accordance with the invention, the method of making a semiconductor signal-translating device comprises placing in contact with a semiconductor body of a given conductivity type a pellet of an impurity-yielding material of the opposite type, heating the body and the pellet to a first temperature above the melting point of the pellet but below that of the body for a sufficient time to cause the pellet to melt, dissolve therein the adjacent region of the body, and to diffuse beyond that region into the body. The method further comprises cooling the body and the pellet, leaving a diffused region of the opposite type on the body and solidifying on the diffused region a recrystallized region of the opposite type. The method additionally comprises placing in contact with the pellet a second pellet of an impurity yielding material of the aforesaid given conductivity type, heating the body and the pellets to a second temperature which is above the melting point of the pellets but below that of the body and that of the aforesaid first temperature for a period of time sufficient to dissolve a portion of the aforesaid recrystallized region and to change its conductivity to the aforesaid given type. The method also includes cooling the body and the pellets to solidify the aforesaid changed conductivity portion and thereby form a semiconductor device in which the recrystallized region of the opposite conductivity type has a low minority-carrier lifetime.

The foregoing and other objects, features and advantages of the invention will be apparent from the following more particular description of a preferred embodiment of the invention, as illustrated in the accompanying drawings.

Figure 1:
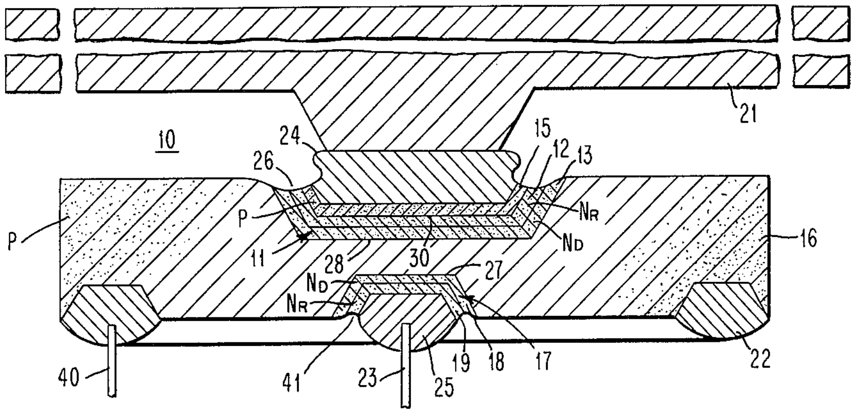
FIGURE 1 is a cross-sectional view of a semiconductor signal translating device in accordance with a particular form of the present invention.

*Description of semiconductor signal-translating of FIGURE 1*

Referring now more particularly to FIGURE 1 of the drawings, the semiconductor signal-translating device 10 comprises a unitary body of suitable semiconductor material such as germanium including a first zone 11 comprising a recrystallized region 12 of one conductivity type, for example the N-type, contiguous with a diffused region 13 of the same type. Each of the regions 12 and 13 is contiguous with a second and third zone of the opposite or P conductivity type and together form a first transistor section 14. See also FIGURE 4 wherein the device under consideration including the transistor section 14 is represented diagrammatically. The recrystallized region 12 is contiguous with a P conductivity type zone 15 which has a relatively low net doping level and is alloyed to region 12 in a manner to be explained subsequently. The diffused N-type region 13 is contiguous with a P conductivity zone 16 which constitutes the germanium starting wafer of the device. The signal-translating device 10 further includes a fourth zone 17 of the aforesaid one or N-type conductivity, comprising an N-type recrystallized region 19 adjoining an N-type diffused region 18, the latter being contiguous with one of the P-type zones, namely the zone 16. Zones 11, 16 and 17 form a second transistor section 20. Reference is again made to FIGURE 4.

The other of the zones of the opposite conductivity type, namely, the P-type zone 15, constitutes the emitter of the first or PNP transistor section 14. This emitter together with the recrystallized region 12 impart to the first transistor section 14, in a manner to be explained subsequently, a current gain that is substantially less than unity, which in turn imparts to that section a high collector breakdown voltage characteristic between zones 11 and 16. The second or NPN transistor section 20 has a characteristic which affords a higher current gain than the first section 14 and in combination with section 14 provides for the device a desired overall current gain. This overall current gain may be approximately unity. For some applications it may be less than unity while for others it may be greater than unity. A device having an overall current gain that is less than unity will be in a nonconducting state when the control-base zone has a bias thereon that is less than or equal to zero, and will be rendered conductive by a positive-going control signal. A device having an overall current gain that is greater than unity will be in a conducting state with a zero or positive bias on its control-base zone but may be held in a nonconducting state by a negative bias on that zone.

The signal-translating device of FIGURE 1 also includes individual electrical connections 21, 22 and 23 to the respective emitter zone 15, the P-type wafer 16, and to the N-type zone 17. Connection 21 may be a heat-dissipating conductor of considerable mass bonded to the P-type zone 15 through a pellet or dot 24 of a suitable alloy. Connection 22 is preferably an annular member of a material such as an indium alloy which is alloyed to the wafer 16 to form an ohmic connection therewith. A wire lead or connection 40 is bonded to the annular connection 22. Connection 23 is a wire lead which is bonded to the recrystallized region 18 of the N conductivity zone 17 through a suitable alloy such as a lead-antimony dot 25. Conventional etching operations including electrolytic etching performed after the fabrication of the device serve to form annular moats 26 and 41 by undercutting the dots 24 and 25 and removing undesirable alloy and semiconductor material from about the peripheral regions of the several PN junctions.

To provide a better understanding of the signal-translating device FIGURE 1, an explanation of its method of manufacture will be helpful in connection with a specific example for the FIGURE 1 embodiment. The P conductivity zone 16 constituting the starting wafer of the device has a diameter of 0.06", a thickness of 0.005", and a resistivity of about 7 ohm cm. An alloy pellet for forming the dot 25 comprises a cylindrical disc 0.010" in diameter, 0.0045" thick, and containing 90% lead and 10% antimony. This pellet, together with a ring for forming the base connection 22 having an outside diameter of 0.06", and inside diameter of 0.04", a thickness of 0.0043" and containing 98% lead and 2% indium, are placed in contact with the lower surface of the wafer 16 in a conventional manner in an alloying fixture. Thereafter a spherical pellet for forming the alloy dot 24 and having a diameter of 0.025" and containing 98.25% lead and 1.75% antimony is oriented in the alloying fixture on the supper surface of the wafer 16.

Figure 2:
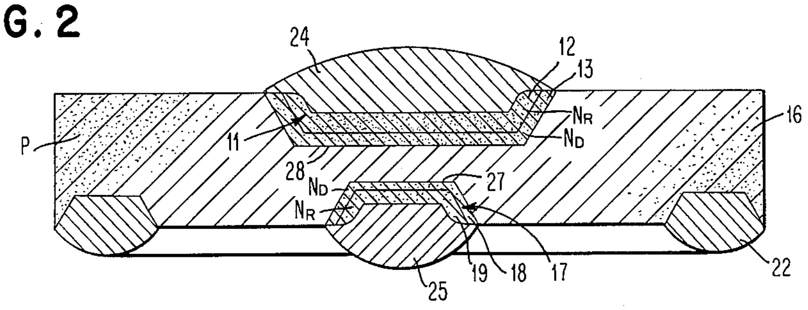
FIGURE 2 is a similar view representing a step in the manufacture of that device.

The loaded alloy fixture is next inserted in an inert or reducing atmosphere in an alloying furnace operating at a temperature within the range of 750 to 800° C. where it is held in the hot zone for about an hour. This temperature is above the melting point of the alloy pellet and the ring and below that of the semiconductor wafer, and the heating period is sufficient to cause the pellets and the ring to melt and dissolve therein the adjacent regions of the wafer 16. The activie impurity antimony in the dots diffuses into the body of the wafer 16, and when the loaded fixture is removed from the furnace and cooled to room temperature, solidification of the molten regions takes place. Referring now to FIGURE 2, it will be seen that there forms on the lower surface of the wafer 26 the annular ohmic connection 22, an N-type diffused region 18 contiguous with the wafer, an N-type recrystallized region 19 which is contiguous with the region 18, and the lead-antimony dot 25. On the upper surface of the wafer 16 there is formed an N-type diffused region 13 which is contiguous with the wafer, an N-type recrystallized region 12 contiguous with the region 13, and the lead-antimony alloy dot 24. The described operation creates a rectification barrier 27 between the N-type diffused region 18 and the P-type wafer 16 and another rectification barrier 28 between the N-type diffused region 13 and the wafer 16.

Figure 3:
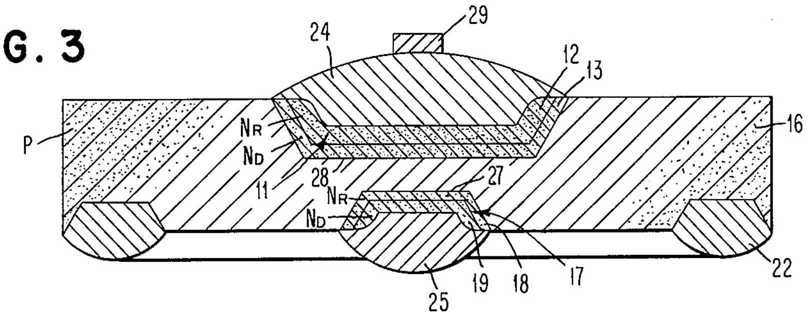
FIGURE 3 is another such view representing a subsequent step in the manufacture of the device.

In the next operation, a small lead alloy pellet 29, as represented in FIGURE 3, of a suitable impurity-yielding material of the opposite or P conductivity type is placed on the alloy pellet 24. In the particular embodiment under consideration, 0.19 microgram of gallium has been employed in the pellet. The loaded alloy jig is then placed in an alloying furnace operating at a temperature of about 50° C. less than that of the first mentioned furnace, 700° C. being a typical temperature when the first mentioned furnace is fired to 750° C. The assembly is held at that lower temperature for a period of time, usually about 10 minutes, which is sufficient to melt the alloy dot 24 and the P-type pellet 29 and to dissolve a portion of the N-type recrystallized region 12. The melted gallium is present in a sufficient quantity to overcompensate the N-type doping in the melted portion of the recrystallized region 12 and thereby to convert it to P-type germanium. When the loaded jig is removed from the alloying furnace and cooled to room temperature, the melted portions of the assembly solidify and there is created, as represented in FIGURE 1, a P-type region 15 which is separated from the recrystallized N-type region 12 by a rectification barrier 30. The region 12 which now remains is somewhat thinner than it was prior to the last firing operation. In a subsequent procedure, the heat-radiating connection 21 and the leads 23 and 40 may be bonded to their respective alloy dots 24 and 25 and the ring 22 in a conventional manner. Etching operations including electrolytic etching in an alkaline bath in accordance with well-known techniques serve to shrink the size of the alloy dots, expose the peripheral regions of the rectification barriers 27, 28 and 30, and to create the moats 26 and 41 shown in FIGURE 1.

The signal-translating device 10 thus formed constitutes a PNPN transistor having a PNP first section 14 which includes a P-type emitter 15, a floating base zone 11 comprising an N-type recrystallized region 12 and an N-type diffused region 13, and further includes a P-type collector zone 16. The floating base zone 11 also is the collector of the NPN second transistor section 20 which includes a P-type base zone 16 and an N-type emitter zone 17. Zone 17 includes an N-type recrystallized region 19 and an N-type diffused region 18, the doping level or impurity concentration therein being sufficiently high so that the emitter 17 of section 20 constitutes a fairly efficient emitter. The geometry or relative areas and concentricity of the emitter 17 with reference to that of the zone 11 also are favorable for a high transport factor in the NPN section 20. It will be recalled that the pellet for forming the alloy dot 25 and the region 19 consists of 90% of the carrier metal lead and 10% of the active impurity antimony, which percentage of antimony assures a high impurity concentration.

The emitter 15 of the PNP section, on the other hand, has a relative low net doping level since the quantity of gallium employed in the pellet 29 of FIGURE 3 to convert a portion of the N-type recrystallized region 12 to P-type germanium is purposely made small. Consequently, the efficiency of the emitter 15 is low, and this in turn is instrumental in part in creating a low current gain or alpha for the PNP section. While such a characteristic would be undesirable in a conventional three-zone transistor employed in a conventional manner, in the PNP section 14 of the unitary PNPN transistor device 10 it affords important advantages which will be pointed out later.

The current multiplication factor alpha or gain of a transistor is dependent upon a number of factors and may be expressed by the relation:

$$\alpha=\gamma\beta\alpha^{*} \quad (1)$$

where $\gamma$ is the emitter efficiency, $\beta$ is the transport efficiency representing the fraction of the injected current reaching the collector, and $\alpha^{*}$ is the collector efficiency. Heretofore during manufacture, the control of the current gain of the PNP section of a four zone germanium transistor has been achieved by controlling the emitter efficiency $\gamma$, a low net doping level in the emitter being effective to establish a low current gain. Unfortunately, the use of this type of control during the manufacture of such a transistor has not proved as reliable as desired for some applications. The composition of the emitter dot often proved to be quite critical, and undesired N-type or intrinsic regions, which impaired operation, sometimes formed during the cooling of the emitter region due to the changes in the segregation coefficients of antimony and gallium with temperature on cooling. These undesired regions impaired the performance of the transistors and reduced the yield of quality devices. While a low doping level desirably reduces the current gain of the PNP section of the four zone transistor, it unfortunately has a tendency to create a higher impedance at the junction 30 when the transistor is conducting than is desired for many switching applications. By creating the N-type recrystallized region 12 and controlling its thickness by way of the temperature differential in the two firing operations, the minority carrier recombination in the N-type zone 11 may be controlled. This in turn controls the transport efficiency $\beta$, or the fraction of the injected carriers from the emitter that reach the collector zone 16 of the PNP section 14. A larger temperature differential results in a thicker N-type recrystallized region, higher minority carrier recombinations with carriers of opposite polarity, and hence a lower transport factor. Thus the transistor under consideration has two means for controlling the current gain of the PNP section during manufacture. If the conductive impedance of the junction 30 is too great, it may be desirably reduced by increasing the doping level in the P-type zone 15, and this higher doping level, which increases the emitter injection efficiency of the PNP section, may be compensated for by decreasing the transport efficiency by the expedient of increasing the width of the recrystallized region 12. Thus the composition of the alloy pellet employed in forming the emitter is no longer the only important factor controlling the gain of the PNP section. Experience has indicated that it is relatively easy during manufacture of the transistor to keep the current gain of the PNP section 14 at a desired low value such as 0.3. This current gain may be at any desired value within the range of from 0.1 to 0.6. The graded resistance of the diffused region 13 aids in assuring a higher breakdown voltage for the device.

As previously mentioned, the doping level of the emitter 17 of the NPN section 20 of the PNPN transistor is high so that the efficiency of that emitter is high, and the section 20 has a considerably greater current gain than the PNP section 14. A typical range for the current gain for the section 20 is 0.9 to 0.6 and this, taken in connection with that in section 14, is such that the overall gain comprising the sum of the two current gains is greater than or less than unity, as desired in accordance with the particular application of the transistor.

It should be understood that while a specific embodiment of the invention and the method of making it have been described in considerable detail, that the example given is merely illustrative of one of the many possibilities in accordance with the principles of the invention. It will be clear to one skilled in the art that various of the semiconductor materials such as silicon, silicon-germanium alloys, and intermetallics may be employed in lieu of germanium, in which instance suitable alloying impurities, firing temperatures, and heating cycles which may be different from those described may be employed. It will also be clear to one skilled in the art that a technique similar to that described above may be employed to manufacture a four terminal device wherein an external connection is made to the N-type region 11. This could be effected by alloying the dot 24 to an N-type skin which previously had been diffused into the upper surface of the wafer 16.

Figure 4:
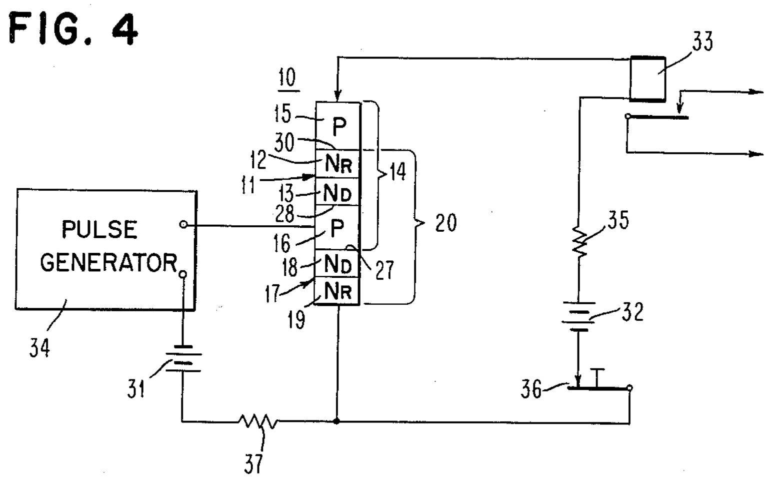
FIGURE 4 is a circuit diagram of a switching arrangement employing the semiconductor signal-translating device of the present invention.

At this time it will be helpful to refer to certain other design considerations more fully to understand the nature of semi-conductor device 10. To that end, reference will be made briefly to a typical circuit application of the device as represented in FIGURE 4 but without considering the details of the operation of that circuit. With the device 10 in the switching environment of FIGURE 4 and operating without an external circuit connection to the zone 11, it will be assumed that it is initially maintained in its nonconductive state by a low-voltage source or battery 31 connected between the zones 16 and 17 of the NPN section 20 of the device and that a relatively high-voltage source 32 is required to supply sufficient energy by way of the device 10 to operate a relay 33 when a control pulse of positive polarity is applied by a pulse generator 34 to the device to render it conductive. For example, in the OFF condition of the device 10, the circuit requirements may necessitate that the device be able to withstand at the common collector junction 28 of the PNP and NPN sections 14 and 20 a peak inverse voltage, hereafter designated V, of about 100 volts which is applied by the battery 32. However, in order to withstand that applied or peak inverse voltage, the effect of avalanche multiplication or avalanche breakdown must be taken into account. Avalanche breakdown is caused by carriers in the semiconductor device 10 being accelerated with such force by a high electrical field applied by the battery 32 to the collector junction 28 that, upon collision of the carriers with atoms in the semiconductor crystal of the device, sufficient additional carriers are produced to create a flow of excessive current that constitutes or coincide with an undesirable breakdown of the junction. To realize the high peak inverse of 100 volts which the semiconductor device 10 must withstand in its off state, it is necessary that the central PN junction 28 have an avalanche breakdown voltage in excess of 100 volts.

The magnitude of the collector junction avalanche breakdown voltage is established by materials of the base-collector regions 11, 16 of the PNP section 14. With the N-type and the P-type zones 11 and 16 having resistivities of about 1.5 and 3 ohm cm., respectively, a predicted avalanche breakdown voltage is about 120 volts. according to Miller and Ebers at page 279 of volume II, of the book "Transistor Technology." Since experience has indicated that the predicted values are generally lower than those which are realized in an actual device, a 7 ohm cm. germanium starting wafer of zone 16 has been employed successfully in the device 10 to obtain that 120 volt figure.

Figure 5:
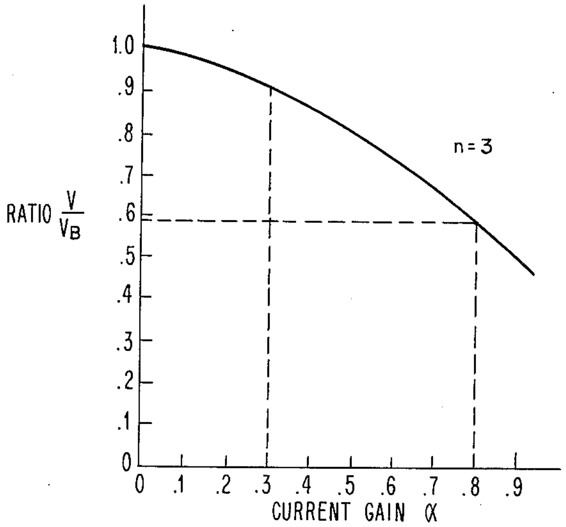
FIGURE 5 is a curve useful in explaining a feature of a semiconductor device of FIGURE 1.

Because no external connection is made to the zone 11 of the PNP section 14, the latter operates in the floating base condition with the assumed 100 volts effectively being applied between its emitter and collection regions 15 and 16. In the article entitled "Alloy Junction Avalanche Transistors" by Miller and Ebers appearing in volume 45 of the Bell System Technical Journal at pages 883 to 902 and dated September 1955, it is shown that avalanche breakdown will occur when the following relation holds:

$$\alpha_N M = 1 \qquad (2)$$

where $\alpha_N$ is the current gain of the PNP transistor section and M is the avalanche multiplication factor. The latter may be expressed by the relation:

$$M = \frac{1}{1 - \left(\frac{V}{V_B}\right)^n} \qquad (3)$$

where V is the applied or peak inverse voltage, $V_B$ is the collector junction avalanche breakdown voltage, and the exponent $n$ is 3 for N-type germanium base material. FIGURE 5 of the drawings represents graphically the relation between $\alpha_N$ and the ratio $V/V_b$ as calculated from Equations (2) and (3). Good design of the transistor of the type under consideration consistent with advantageous use of the materials therein exists when the peak inverse voltage V thereof is a major fraction of the junction avalanche breakdown voltage $V_B$, it being preferable that V be nearly eaqual to $V_B$ if such a result is attainable. It has been previously stated that materials selected for the base-collector regions 11, 16 of transistor section 14 establish the collector avalanche breakdown voltage at 120 volts. This in itself is not too easy to attain. From the curve of FIGURE 5 it will be seen that if the current gain of the PNP section is 0.3, then the ratio $V/V_B$ is about 0.88. Substituting the value of 120 volts for $V_B$ in that ratio, we find that the peak inverse voltage V which is realized is about 105 volts, which is entirely satisfactory since it is about 5 volts higher than the 100 volt figure demanded by the circuit application of FIGURE 4 under consideration. Since the doping level of the gallium in the P-type zone 15 and also the width of the recrystallized N-type region 12 of the floating base region 11 have produced a PNP section 14 with a current gain of about 0.3, the nature of the semiconductor device 10 is such that it is capable of withstanding a high peak inverse voltage of 100 volts. Hence the device may be said to have a high breakdown voltage characteristic.

Assuming for the moment that the PNP transistor section 14 of the unitary transistor structure is one of the prior art type that lacked the recrystallized N-type region 12 and had a relatively high emitter injection efficiency which afforded a current gain of about 0.8, it will be seen from the curve of FIGURE 5 that the ratio $V/V_B$ would be about 0.59. A PNPN transistor with such a PNP section would only be capable of withstanding a peak inverse voltage of about 70.8 volts and hence would fail to meet the previously indicated stiff requirement of 100 volts.

*Description of FIGURE 4 circuit*

At this time it will be helpful to consider more fully a typical use of the PNPN semiconductor device 10 represented in FIGURE 1. In FIGURE 4, the device 10 is represented diagrammatically as a switching means for selectively controlling the flow of current through the relay winding 33. The latter is connected between the zones 15 and 17 through a resistor 35, which may comprise in whole or in part the resistive impedance of the winding 33, the battery 32 which is poled as indicated, and a switch 36 which is controllable manually or mechanically by a suitable device such as a cam. As previously mentioned, the zone 15 serves as the emitter of the PNP section 14 while the zone 17 serves as the emitter of the NPN section 20 and also as one of the output electrodes of the device 10. Zone 16 of the NPN section serves as the controllable base electrode of the device 10. The PN junction 27 is biased in the reverse direction by a small voltage such as about −0.3 volt supplied by the battery 31, one terminal of which is connected through the pulse generator 33 to the zone 16 and the other terminal of which is connected to the zone 17 through a current-limiting resistor 37.

*Explanation of operation of FIGURE 4 circuit*

In considering the operation of the circuit of FIGURE 4, it will be assumed that the reverse biased junction 27 just mentioned maintains the device 10 nonconductive and permits only a small reverse current to flow across the barrier 27. The leakage current of the device flowing between the zones 15 and 17 is also small and the peak inverse voltage applied by the battery 32 to the device is about 100 volts. With the switch 36 closed as indicated, the application of a small positive-going pulse of about 0.3 volt supplied by the pulse generator 34 will reduce the bias on the junction 27 to approximately zero and render the transistor 10 conductive. Current supplied by the battery 32 will flow through the resistor 35, the relay winding 33, and the transistor from the zone 15 to the zone 17 and to the negative terminal of the battery. Resistor 35 serves as a current-limiting resistor and, since no phase inversion occurs in either the PNP or the NPN transistor sections 14 and 20, respectively, the circuit is regenerative so as suddenly to develop a heavy flow of saturation current such as about 500 milliamperes which is sufficient to cause saturation of the device 10 and to operate the relay 33. Switching in less than 1 microsecond may be realized. Because of this regeneration, the full current continues even when the control pulse supplied by the pulse generator 34 terminates and the circuit acts like a thyratron circuit. The impedance presented by the conductive device 10 between its zone 15 and 17 is extremely low so that the power dissipated in the transistor is very small, thus assuring the transistor of a very long life. Current flow may be terminated by opening the switch 36 so as to interrupt the output circuit of the device 10. Thus it will be seen that when a semiconductor device of the type under consideration is employed in the circuit of FIGURE 4, it is capable of being held in its nonconductive condition by a relatively small bias voltage, leakage current at this time being very small and the peak inverse voltage being high. A small input signal is effective to render the device abruptly conductive, thereby creating a heavy flow of current which is effective to operate a device such as a relay that requires for its actuation a large flow of current.

While the invention has been particularly shown and described with reference to a preferred embodiment thereof, it will be understood by those skilled in the art that various changes in form and details may be made therein without departing from the spirit and scope of the invention.

What is claimed is:

1. A semiconductor signal-translating device comprising: a unitary body of semiconductor material including a first zone comprising a recrystallized region of one conductivity type contiguous with a diffused region of said one type, a second zone and a third zone of the opposite conductivity type, each of said regions of said first zone being contiguous with one of said zones of the opposite conductivity type and together form a first transistor section, and further including a fourth zone of said one conductivity type contiguous with one of said zones of the opposite conductivity type and forming therewith and with said first zone a second transistor section, the other of said zones of said opposite conductivity type constituting the emitter of said first section which, with said recrystallized region, provide for said first section a current gain of substantially less than unity and impart to said first section a high breakdown voltage characteristic, said second transistor section having a characteristic which affords a higher current gain than said first section and is effective to provide for said device a desired overall current gain; and individual electrical connections to said device.

2. A semiconductor signal-translating device comprising: a unitary body of semiconductor material including a first zone comprising a recrystallized region of one conductivity type contiguous with a diffused region of said one type, a second zone and a third zone of the opposite conductivity type, each of said regions of said first zone being contiguous with one of said zones of the opposite conductivity type and together form a first transistor section, and further including a fourth zone of said one conductivity type contiguous with one of said zones of the opposite conductivity type and forming therewith and with said first zone a second transistor section, the other of said zones of said opposite conductivity type constituting the emitter of said first section which, with said recrystallized region, provide for said first section a current gain in the range of 0.1 to 0.6 and impart to said first section a high breakdown voltage characteristic, said second transistor section having a characteristic which affords a current gain in the range of 0.9 to 0.6 and is effective to provide for said device a desired overall current gain that is the sum of the individual current gains of said sections; and individual electrical connections to said device.

3. A semiconductor signal-translating device comprising: a unitary body of semiconductor material including a first zone comprising a recrystallized region of one conductivity type contiguous with a diffused region of said one type, a second zone and a third zone of the opposite conductivity type, each of said regions of said first zone being contiguous with one of said zones of the opposite conductivity type and together form a first transistor section, and further including a fourth zone of said one conductivity type contiguous with one of said zones of the opposite conductivity type and forming therewith and with said first zone a second transistor section, the other of said zones of said opposite conductivity type constituting the emitter of said first section which, with said recrystallized region, provide for said first section a current gain of substantially 0.3 and impart to said first section a high breakdown voltage characteristic, said second transistor section having a characteristic which affords a higher current gain than said first section and is effective to provide for said device an overall current gain that is greater than unity; and individual electrical connections to said emitter, said fourth zone of said one type, and said one zone of said opposite type.

4. A semiconductor signal-translating device comprising: a unitary body of germanium semiconductor material including a first zone comprising a recrystallized region of one conductivity type contiguous with a diffused region of said one type, a second zone and a third zone of the opposite conductivity type, each of said regions of said first zone being contiguous with one of said zones of the opposite conductivity type and together form a first transistor section, and further including a fourth zone of said one conductivity type contiguous with one of said zones of the opposite conductivity type and forming therewith and with said first zone a second transistor section, the other of said zones of said opposite conductivity type constituting the emitter of said first section which with said recrystallized region, provide for said first section a substantially constant current gain of substantially less than unity and impart to said first section a high breakdown voltage characteristic, said second transistor section having a characteristic which affords a higher current gain than said first section and is effective to provide for said device a desired overall current gain; and individual electrical connections to said device.

5. A PNPN semiconductor signal-translating device comprising: a unitary body of germanium semiconductor material including a first zone comprising a recrystallized region of N conductivity type contiguous with a diffused region of said N type, a second zone and a third zone of P conductivity type, each of said regions of said first zone being contiguous with one of said zones of the P conductivity type and together forming a first PNP transistor section and further including a fourth zone of said N conductivity type contiguous with one of said zones of the P conductivity type and forming therewith and with said first zone a second NPN transistor section, the other of said zones of said P conductivity type constituting the emitter of said first section which, with said recrystallized region, provide for said first section a current gain in the range of 0.1 to 0.6 and impart to said first section a high breakdown voltage characteristic in the absence of an external circuit connection to said first zone, said second transistor section having a characteristic which affords a current gain in the range of 0.9 to 0.6 and is effective to provide for said device a desired overall current gain that is the sum of the individual current gains of said sections; and individual electrical connections to said emitter, said fourth zone of said N type, and said one zone of said P type.

6. A PNPN semiconductor signal-translating device comprising: a unitary body of semiconductor material including a first zone comprising an N-type recrystallized region contiguous with an N-type diffused region, a second zone and a third zone of P-conductivity type, each of said regions of said first zone being contiguous with one of said P-type zones and together forming a first transistor section, and further including a fourth zone of N-type conductivity contiguous with one of said P-type zones and forming therewith and with said first zone a second transistor section, the other of said P-type zones constituting the emitter of said first section and having a low injection efficiency which, with said recrystallized region, provide for said first section a current gain of substantially less than unity and impart to said first section a high breakdown voltage characteristic, said second transistor section having a characteristic which affords a higher current gain than said first section and is effective with that of said first section to provide for said device an overall current gain that is greater than unity; and individual electrical connections to said device.

7. A PNPN semiconductor signal-translating device comprising: a unitary body of semiconductor material including a first zone comprising an N-type recrystallized region contiguous with an N-type diffused region, a second zone and a third zone of P-conductivity type, said recrystallized region of said first zone being contiguous with one of said P-type zones which is alloyed thereto and has a low net doping level, said diffused region of said first zone being contiguous with the other of said P-type zones, said first, second and third zones together forming a first transistor section, and further including a fourth zone of N-type conductivity alloyed to said other P-type zone and forming therewith and with said first zone a second transistor section, said one P-type zone constituting the emitter of said first section and having a low injection efficiency because of said doping level and which, with said recrystallized region, provide for said first section a current gain of substantially less than unity and impart to said first section a high breakdown voltage characteristic, said second transistor section having a characteristic which affords a higher current gain than said first section and is effective with that of said first section to provide for said device an overall current gain that is greater than unity; and individual electrical connections to said device.

8. The method of making a semiconductor signal-translating device comprising: placing in contact with a semiconductor body of a given conductivity type a first pellet of an impurity-yielding material of the opposite conductivity type; heating said body and pellet to a first temperature above the melting point of said pellet but below that of said body for a sufficient time to cause said pellet to melt, dissolve therein the adjacent region of said body and to diffuse beyond said region into said body; cooling said body and pellet, leaving a diffused region of said opposite type on said body and solidifying on said diffused region a recrystallized region of said opposite type; placing in contact with said pellet a second pellet of an impurity-yielding material of said given conductivity type; heating said body and said pellets to a second temperature which is above said melting point of said pellets but below that of said body and that of said first temperature for a period of time sufficient to dissolve a portion of said recrystallized region and to change its conductivity to said given type; and cooling said body and pellets to solidify said changed conductivity portion and thereby form a semiconductor device in which said recrystallized region of said opposite type has a low minority-carrier lifetime.

9. The method of making a semiconductor signal-translating device comprising: placing in contact with a germanium semiconductor body of a given conductivity type a first pellet of an impurity-yielding material of the opposite conductivity type; heating said body and pellet to a temperature of about 750° C. for a sufficient time to cause said pellet to melt, dissolve therein the adjacent region of said body, and to diffuse beyond said region into said body; cooling said body and pellet, leaving a diffused region of said opposite type on said body and solidifying on said diffused region a recrystallized region of said opposite type; placing in contact with said pellet a second pellet of an impurity-yielding material of said given conductivity type; heating said body and said pellets to a temperature of about 700° C. for a period of time sufficient to dissolve a portion of said recrystallized region and to change its conductivity to said given type; and cooling said body and pellets to solidify said changed conductivity portion and thereby form a semiconductor device in which said recrystallized region of said opposite type has a low minority-carrier lifetime.

10. The method of making a semiconductor signal-translating device comprising: placing in contact with a germanium semiconductor body of a P conductivity type a first pellet of an impurity-yielding material of the N-conductivity type; heating said body and pellet to a first temperature within the range of 750° C. to 800° C. for a sufficient time to cause said pellet to melt, dissolve therein the adjacent region of said body, and to diffuse beyond said region into said body; cooling said body and pellet, leaving a diffused region of said N type on said body and solidifying on said diffused region a recrystallized region of said N type; placing in contact with said pellet a second pellet of an impurity-yielding material of said P conductivity type; heating said body and said pellets to a second temperature which is about 50° C. below that of said first temperature for a period of time sufficient to dissolve a portion of said recrystallized region and to change its conductivity to said P type; and cooling said body and pellets to solidify said changed conductivity portion and thereby form a semiconductor device in which said recrystallized region of said N type has a low minority-carrier lifetime.

11. The method of making a PNPN semiconductor signal-translating device comprising: placing in contact with a germanium semiconductor body of a P conductivity type a first pellet comprising 98.25% lead and 1.75% antimony; heating said body and pellet to a first of about 750° C. temperature for about an hour to cause said pellet to melt, dissolve therein the adjacent region of said body, and to diffuse beyond said region into said body; cooling said body and pellet, leaving a diffused region of N conductivity type on said body and solidifying on said diffused region a recrystallized region of said N type; placing in contact with said pellet a second pellet containing lead and gallium; heating said body and said pellets to a second temperature which is about 50° C. below that of said first temperature for about 10 minutes to dissolve a portion of said recrystallized region and to permit said gallium pellet to change its conductivity to said P type; and cooling said body and pellets to solidify said changed conductivity portion and thereby form a semiconductor device in which said recrystallized region of said N type has a low minority-carrier lifetime.

12. The method of making a semiconductor signal-translating device comprising: placing in contact with one surface of a semiconductor body of a given conductivity type a pellet of an impurity-yielding material of the opposite conductivity type; placing in contact with another surface of said semiconductor body another pellet of an impurity-yielding material of said opposite type and having a doping level much less than that of said first-mentioned pellet; heating said body and pellets to a first temperature above the melting point of said pellets but below that of said body for a sufficient time to cause said pellets to melt, dissolve therein the adjacent regions of said body, and to diffuse beyond said regions into said body; cooling said body and pellets to solidify, leaving said diffused regions of said opposite type on said body and solidifying on said diffused regions recrystallized regions of said opposite type; placing in contact with said other pellet a second pellet of an impurity-yielding material of said given conductivity type; heating the assembly of said body and said pellets to a second temperature which is above said melting point of said pellets but below that of said body and that of said first temperature for a period of time sufficient to dissolve a portion of said recrystallized region under said second pellet and to change its conductivity to said one type; and solidifying said assembly including said changed conductivity portion by cooling to form said device.

References Cited by the Examiner

UNITED STATES PATENTS

| | | | |
|---|---|---|---|
| 2,842,723 | 7/58 | Koch et al. | 317—235 |
| 2,849,664 | 8/58 | Beale | 317—235 |
| 2,877,359 | 3/59 | Ross | 317—235 X |
| 2,900,286 | 8/59 | Goldstein | 148—1.5 |
| 2,937,960 | 5/60 | Pankove | 148—1.5 |
| 2,989,426 | 6/61 | Rutz | 148—1.5 |
| 3,001,895 | 9/61 | Schwartz et al. | 317—235 X |

OTHER REFERENCES

Lesk: Germanium P-N-P-N Switches, IRE Transactions on Electron Devices, January 1959, vol. ED-6, pages 28–35.

JOHN W. HUCKERT, *Primary Examiner.*

SAMUEL BERNSTEIN, DAVID J. GALVIN, *Examiners.*